(12) United States Patent
Wang

(10) Patent No.: US 10,679,797 B2
(45) Date of Patent: Jun. 9, 2020

(54) RIPPLE CURRENT GENERATING CIRCUIT

(71) Applicant: MORNSUN GUANGZHOU SCIENCE & TECHNOLOGY CO., LTD., Guangdong (CN)

(72) Inventor: Baojun Wang, Guangdong (CN)

(73) Assignee: MORNSUN GUANGZHOU SCIENCE & TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/313,011

(22) PCT Filed: Jun. 13, 2017

(86) PCT No.: PCT/CN2017/088006
§ 371 (c)(1),
(2) Date: Dec. 22, 2018

(87) PCT Pub. No.: WO2018/024038
PCT Pub. Date: Feb. 8, 2018

(65) Prior Publication Data
US 2019/0221373 A1    Jul. 18, 2019

(30) Foreign Application Priority Data

Aug. 5, 2016    (CN) .......................... 2016 1 0639668

(51) Int. Cl.
*G01R 31/64*    (2020.01)
*H01G 9/14*    (2006.01)
(Continued)

(52) U.S. Cl.
CPC .............. *H01G 9/14* (2013.01); *G01R 31/00* (2013.01); *G05F 1/565* (2013.01); *H01G 9/008* (2013.01); *H01G 9/28* (2013.01)

(58) Field of Classification Search
CPC . H01G 9/14; H01G 9/28; H01G 9/008; G01R 31/00; G01R 31/64; G05F 1/565
See application file for complete search history.

(56) References Cited

U.S. PATENT DOCUMENTS 5,854,473 A * 12/1998 Malnoe .................. H05B 6/062
                                                                219/626
2012/0021263 A1* 1/2012 Nishi .................. B60L 11/1875
                                                                429/62
(Continued)

FOREIGN PATENT DOCUMENTS

CN    103954821    7/2014
CN    105242737    1/2016
(Continued)

OTHER PUBLICATIONS

"International Search Report (Form PCT/ISA/210)", dated Aug. 31, 2017, with English translation thereof, pp. 1-4.

*Primary Examiner* — G. M. A Hyder
(74) *Attorney, Agent, or Firm* — JCIPRNET

(57) ABSTRACT

Provided is a ripple current generating circuit, which comprises an indicating circuit based on an existing ripple current generating circuit. The indicating circuit comprises a resistor, a capacitor, a diode, and a light-emitting diode (LED). The indicating circuit is formed by connecting the LED and the diode that are reversely connected in parallel first to the resistor in parallel and then to the capacitor in series. The capacitor is low in capacity and serves to block direct current while allowing high frequency to pass. With increasing ESR of a tested capacitor, a high-frequency ripple voltage generated by a high-frequency exciting current across the ESR may rise accordingly. Since the capacitor is capable of allowing high frequency to pass, the LED will
(Continued)

emit light when the high-frequency ripple voltage reaches a particular threshold that can be adjusted by adjusting the resistance of the resistor.

9 Claims, 7 Drawing Sheets

(51) Int. Cl.
    *G05F 1/565*     (2006.01)
    *G01R 31/00*     (2006.01)
    *H01G 9/008*     (2006.01)
    *H01G 9/28*     (2006.01)

(56) References Cited

U.S. PATENT DOCUMENTS

| | | | | |
|---|---|---|---|---|
| 2016/0001661 | A1* | 1/2016 | Hatanaka | H02M 1/44 |
| | | | | 307/10.1 |
| 2019/0020270 | A1* | 1/2019 | Wang | H05B 45/00 |
| 2019/0025363 | A1* | 1/2019 | Wang | H01H 9/161 |
| 2019/0029086 | A1* | 1/2019 | Wang | G06F 1/263 |

FOREIGN PATENT DOCUMENTS

| | | |
|---|---|---|
| CN | 105302217 | 2/2016 |
| CN | 105676936 | 6/2016 |
| CN | 105676937 | 6/2016 |
| CN | 106093665 | 11/2016 |
| CN | 106292820 | 1/2017 |
| JP | H06335244 | 12/1994 |
| WO | 2016055515 | 4/2016 |

\* cited by examiner

RIPPLE CURRENT GENERATING CIRCUIT

CROSS-REFERENCE TO RELATED APPLICATION

This application is a 371 application of an international PCT application serial no. PCT/CN2017/088006, filed on Jun. 13, 2017, which claims priority to and the benefit of China Patent Application No. CN201610639668.X, filed on Aug. 5, 2016. The entirety of each of the above-mentioned patent applications is hereby incorporated by reference herein and made a part of this specification.

TECHNICAL FIELD

The present invention relates to a ripple current generating circuit, and more particularly to a ripple current generating circuit for use in an aging test on the service life of an electrolytic capacitor.

BACKGROUND ART

At present, switching power supplies have been extensively used. For applications with input power below 75 W and having no requirement on power factor (PF), Fly-back switching power supplies may have fascinating advantages, which have been presented in Chinese patent applications No. 201510753470.X and No. 201510753530.8, both entitled "RIPPLE CURRENT GENERATING CIRCUIT". Moreover, the two applications also introduce that there is no effective testing method and instrument to control the rated ripple current of an electrolytic capacitor at present and present technical solutions to provide a ripple current generating circuit that can provide a high-frequency ripple current to test an electrolytic capacitor at low cost and low energy consumption. For convenience, the "electrolytic capacitor" is hereinafter referred to as a "capacitor".

The two patent applications cited above are hereinafter referred to as existing patent A (201510753470.X) and existing patent B (201510753530.8) respectively, in an order that they are presented herein. The solutions of the two above patent applications still have problems: when a tested capacitor is about to be out of operation and the Equivalent Series Resistance (ESR) thereof increases greatly, the performance of the capacitor is already close to be out of use. If the capacitor is not shut down at this point, the capacitor will be in an accelerated out-of-operation mode. Once the capacitor is out of operation, the body of the capacitor can be exploded, and the electrolyte in the capacitor will fly to everywhere, which is difficult to clean. Furthermore, many associated failures will be caused, so that losses are added. For example, a field-effect transistor Q may be exploded, which may result in shadow over the hearts of the operators of test equipment and thus stop them from operations on equipment.

In the existing patent A, a direct-current power supply and an inductor are used for supplying power. A transformer, a diode, a field-effect transistor and a pulse width modulation control circuit constitute a core main body of a circuit according to a method set forth in the claims, and the function of the circuit is to generate a ripple current and return the electric energy consumed when generating the ripple current to the direct-current power supply or a tested capacitor through a second winding nearly without loss. For convenience, this part of circuit for generating the ripple current and returning the energy nearly without loss is referred to as a lossless ripple current generator circuit, a lossless ripple current generator for short.

In the existing patent B, a direct-current power supply and a first inductor are used for supplying power. A second inductor, a first diode, a second diode, two field-effect transistors and a pulse width modulation control circuit constitute a core main body of a circuit according to a method set forth in the claims, and the function of the circuit is to generate a ripple current and return the electric energy consumed when generating the ripple current to the direct-current power supply or a tested capacitor through the second inductor, the first diode and the second diode nearly without loss. For convenience, this part of circuit for generating the ripple current and returning the energy nearly without loss is also referred to as a lossless ripple current generator circuit, a lossless ripple current generator for short too.

The technical terms "lossless ripple current generator" present below and in the claims has the same meaning with relevant circuits in the above existing patents A and B, i.e., a circuit for generating a ripple current and returning the electric energy consumed when generating the ripple current to a direct-current power supply or a tested capacitor nearly without loss.

Further, this problem is solved in the patent applications No. 201610040377.9 and 201610040376.4. The technical solutions for this problem are summarized as follows: an indicating circuit is interposed between a direct-current power supply U and a tested capacitor circuit. The indicating circuit is composed of an inductor L and a light-emitting diode (LED) connected in parallel. The current direction of supplying power to the outside by the direct-current power supply U is opposite to the forward switch-on direction of the LED. When the tested capacitor performs normally, the exciting current of the switching transistor Q basically does not appear in the inductor L and the LED does not emit light. When the ESR of the tested capacitor increases greatly, the exciting current of Q appears in L, and when Q is switched off, the exciting current flowing through L cannot change suddenly. A follow current is generated by the light emitted LED, and meanwhile, the LED is driven to emit light, thus prompting a user.

The latter two patent applications cited above are referred to as existing patent C (201610040377.9) and existing patent D (201610040376.4), respectively, in an order that they are presented herein. The existing patent C and the existing patent D also have problems.

An inductor L is used for isolating a power supply from a tested capacitor, so that the direct-current power supply only provides direct current and the tested capacitor provides a high-frequency ripple current. The inductor L is required to have high inductance. However, the inductor L also needs to be used for realizing an indicating circuit and thus is required to have appropriate inductance, because high inductance may cause problem to the indicating circuit. That is, the indicating circuit may start to indicate when the ESR of the tested capacitor increases slightly, which is inconvenient to use.

Therefore, it is desirable to provide a ripple current generating circuit comprising an inductor L that is only used for isolating a power supply so that the direct-current power supply only provides direct current. The inductor L may not provide an indicating signal. The indicating signal for the capacitor failure is provided by other circuit for immediate shutdown by equipment or an operator.

SUMMARY OF THE INVENTION

In view of the above problems, the present invention aims to resolve the shortcomings of the existing ripple current generating methods and circuits and provide a ripple current generating circuit comprising an inductor L that is only used for isolating a power supply, with an indicating signal for a tested capacitor failure being provided by other indicating circuit. It also has the characteristics of low cost, simple indicating circuit and ease of use.

The present invention provides a ripple current generating circuit, which, as solution 1, comprises a direct-current power supply, a first inductor, a lossless ripple current generator, and output terminals, including a positive terminal and a negative terminal, that are connected to two pins of a tested capacitor. The output terminal of the direct-current power supply has a positive terminal and a negative terminal. The lossless ripple current generator comprises at least a pulse width modulation control circuit.

The output terminals are connected in parallel to the direct-current power supply after being connected in series to the inductor.

The lossless ripple current generator is connected in parallel to the output terminals, and configured to generate a ripple current and return the electric energy consumed when generating the ripple current to the direct-current power supply or the tested capacitor nearly without loss.

The pulse width modulation control circuit has a maximum duty cycle of less than 0.5.

An indicating circuit is further connected in parallel between the positive terminal and the negative terminal. The indicating circuit is characterized by comprising a first resistor, a first capacitor, a first diode and a first light-emitting diode, with the first resistor, the first diode and the first light-emitting diode being connected in parallel. The first light-emitting diode and the first diode are reversely connected in parallel to form a two-terminal network that is hereinafter referred to as a parallel network of which the terminals are differentiated by an anode of the first diode and a cathode of the first diode; and the parallel network is then connected in series to the first capacitor to form a two-terminal series network that is hereinafter referred to as a series network of which the two terminals serve as a first terminal and a second terminal of the indicating circuit, respectively.

The present invention provides a ripple current generating circuit, which, as solution 2, comprises a direct-current power supply, a first inductor, a lossless ripple current generator, and output terminals, including a positive terminal and a negative terminal, that are connected to two pins of a tested capacitor. The output terminal of the direct-current power supply has a positive terminal and a negative terminal. The lossless ripple current generator comprises at least a pulse width modulation control circuit.

The output terminals are connected in parallel to the direct-current power supply after being connected in series to the inductor;

The lossless ripple current generator is connected in parallel to the output terminals, and configured to generate a ripple current and return the electric energy consumed when generating the ripple current to the direct-current power supply or the tested capacitor nearly without loss.

The pulse width modulation control circuit has a maximum duty cycle of less than 0.5.

An indicating circuit is further connected in parallel between the positive terminal and the negative terminal. The indicating circuit is characterized by comprising a first resistor, a second resistor, a first capacitor, a second capacitor, a first diode and a second diode and a first light-emitting diode, which are connected as follows: the second resistor being connected in series to the first light-emitting diode to form a first network with two terminals, the first network being connected in parallel to both the second capacitor and the first resistor to form a second network with two terminals, the second network being then connected in series to the second diode to form a third network with two terminals that is characterized in that the second diode and the first light-emitting diode are in the same direction, the third network being reversely connected in parallel to the first diode to form a fourth network with two terminals, and the fourth network being then connected in series to the first capacitor to form a two-terminal series network that is hereinafter referred to as a series network of which the two terminals serve as a first terminal and a second terminal, respectively.

Preferably, the above solution 1 and the solution 2 are characterized in that the first light-emitting diode is a light emitter in an optical coupler, i.e., a light-emitting diode in the optical coupler.

The working principle will be described in detail in combination with embodiments.

Advantages of the Present Invention

A high-frequency ripple current can be provided at low cost and low energy consumption. The indicator thereof is only used for isolating the power supply but not for providing an indicating signal. It can also be realized that before an electrolytic capacitor is out of operation, the light-emitting diode in the light emitter emits light or there is current flowing through the light-emitting diode in the optical coupler, and the optical coupler outputs an isolated signal to inform a user or the circuit. In addition, the preset ESR is adjustable before the electrolytic capacitor is out of operation.

BRIEF DESCRIPTION OF THE DRAWINGS

FIG. 2-1 is a schematic diagram of a first embodiment of an indicating circuit corresponding to the solution 1 of the present invention.

FIG. 2-2 is a schematic diagram of an equivalent implementation 1 of the first embodiment of the indicating circuit corresponding to the solution 1 of the present invention.

FIG. 2-3 is a schematic diagram of an equivalent implementation 2 of the first embodiment of the indicating circuit corresponding to the solution 1 of the present invention.

FIG. 2-4 is a schematic diagram of an equivalent implementation 3 of the first embodiment of the indicating circuit corresponding to the solution 1 of the present invention.

FIG. 3 is a schematic diagram of a path of a charging current generated by a direct-current power supply U in FIG. 1.

FIG. 4 is oscillograms of a driving voltage Ugs for a gate and a source of a switching transistor Q, an exciting current $i_1$ of a main power level and a working current $i_{out}$ of a tested capacitor in FIG. 1.

FIG. 7-1 is a schematic diagram of a second embodiment of an indicating circuit corresponding to the solution 2 of the present invention.

FIG. 7-2 is a schematic diagram of an equivalent implementation 1 of the second embodiment of the indicating circuit corresponding to the solution 2 of the present invention.

FIG. 7-3 is a schematic diagram of an equivalent implementation 2 of the second embodiment of the indicating circuit corresponding to the solution 2 of the present invention.

FIG. 7-4 is a schematic diagram of an equivalent implementation 3 of the second embodiment of the indicating circuit corresponding to the solution 2 of the present invention.

DETAILED DESCRIPTION OF THE INVENTION

First Embodiment

Figure 1:
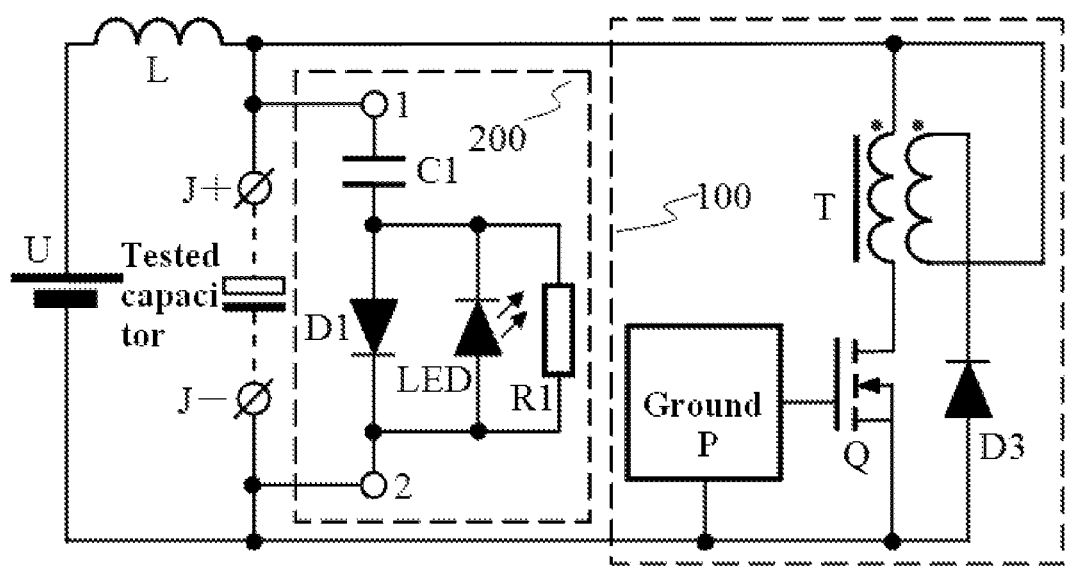
FIG. 1 is a schematic diagram of a first embodiment of the technical solution of the present invention.

Referring to FIG. 1, a ripple current generating circuit, corresponding to the solution 1, comprises a direct-current power supply U, a first inductor L, a lossless ripple current generator 100, and output terminals, including a positive terminal J+ and a negative terminal J−, that are connected to two pins of a tested capacitor. The direct-current power supply U has a positive terminal and a negative terminal. The lossless ripple current generator 100 comprises at least a pulse width modulation control circuit P.

The output terminals are connected in parallel to the direct-current power supply U after being connected in series to the inductor L.

The lossless ripple current generator 100 is connected in parallel to the output terminals, and configured to generate a ripple current and return the electric energy consumed when generating the ripple current to the direct-current power supply U or the tested capacitor nearly without loss.

The pulse width modulation control circuit has a maximum duty cycle of less than 0.5.

Figures 1, 2:
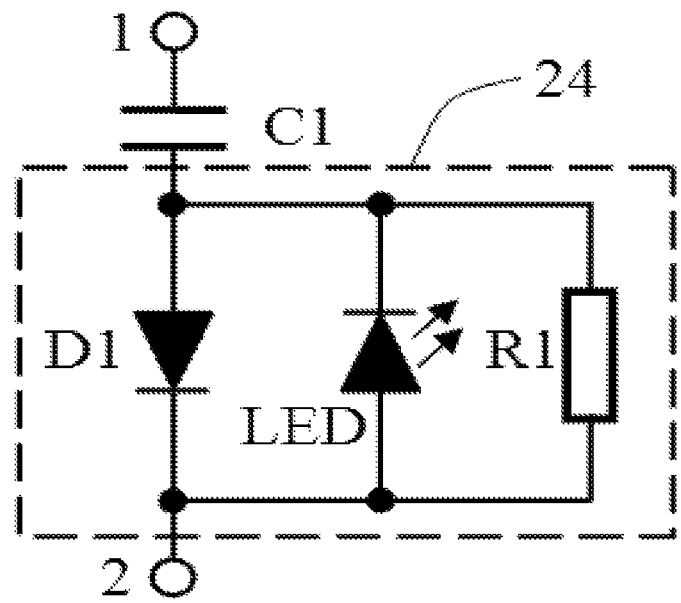
Figure 2:
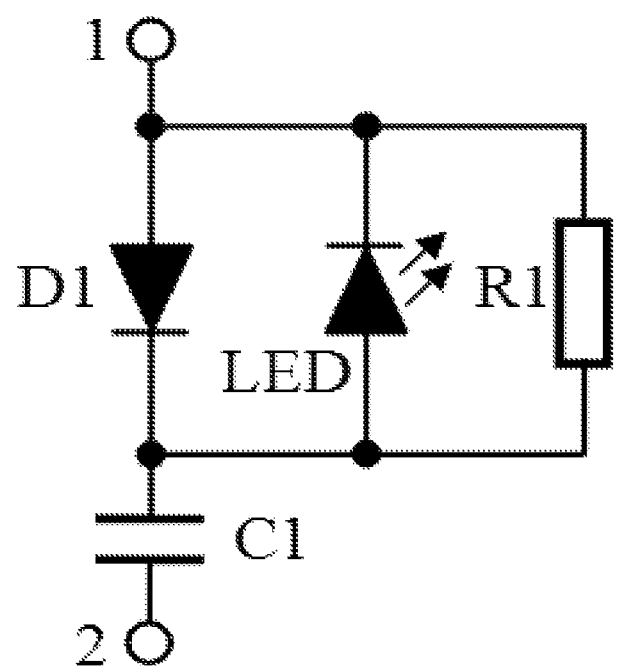

An indicating circuit 200 is further connected in parallel between the positive terminal J+ and the negative terminal J−. The schematic diagram of the separated indicating circuit 200 is as shown in FIG. 2-1. The indicating circuit 200 is characterized by comprising a first resistor R1, a first capacitor C1, a first diode D1 and a first light-emitting diode LED. The first resistor R1, the first diode D1 and the first LED are connected in parallel, wherein the first LED and the first diode D1 are reversely connected in parallel to form a two-terminal network that is hereinafter referred to as a parallel network 24 of which the terminals are differentiated by an anode of the first diode D1 and a cathode of the first diode D1. The parallel network 24 is then connected in series to the first capacitor C1 to form a two-terminal series network that is hereinafter referred to as a series network of which the two terminals serve as a first terminal 1 and a second terminal 2 of the indicating circuit, respectively.

Apparently, the first terminal 1 is connected to the positive terminal J+ and the second terminal 2 is connected to the negative terminal J−. However, the circuit also can work if the first terminal 1 is connected to the negative terminal J− and the second terminal 2 is connected to the positive terminal J+.

Reverse parallel connection means that the anode of the first diode D1 is connected to the cathode of the first LED while the cathode of the first diode D1 is connected to the anode of the first LED.

The first capacitor C1 is hereinafter referred to as C1, the first resistor R1 is hereinafter referred to as R1 and the first LED is hereinafter referred to as LED, and so are other devices.

C1 is connected in series to the parallel network 24 to form the indicating circuit 200. As a series circuit, the function does not change after the interchange of positions. Therefore, the solution 1 may include a plurality of series connection methods, but the function remains the same, as described below.

(a) The cathode of D1 is downward and C1 is on the upper side, as shown in FIG. 2-1. The anode of D1 is connected to one end of C1, and the other end of C1 serves as the first terminal 1 of the indicating circuit, while the cathode of D1 serves as the second terminal 2 of the indicating circuit.

(b) The cathode of D1 is downward and C1 is on the lower side, as shown in FIG. 2-2. The cathode of D1 is connected to one end of C1, and the anode of D1 serves as the first terminal 1 of the indicating circuit, while the other end of C1 serves as the second terminal 2 of the indicating circuit.

Figures 2, 3:
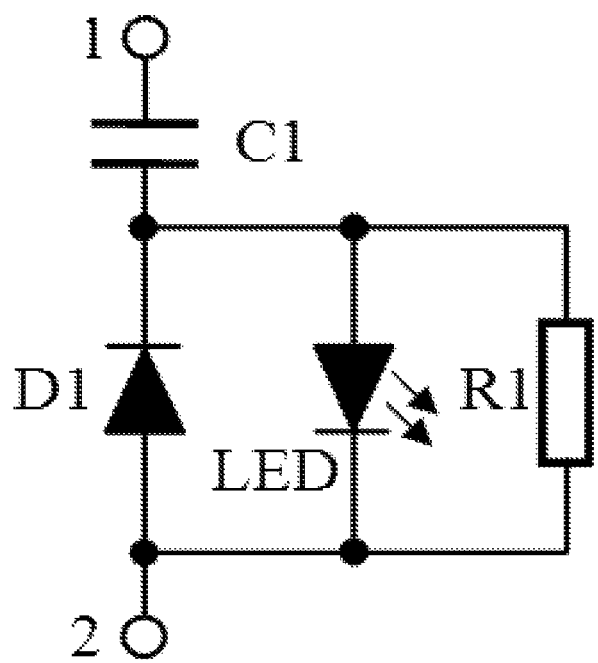

(c) The cathode of D1 is upward and C1 is on the upper side, as shown in FIG. 2-3. The cathode of D1 is connected to one end of C1 and the other end of C1 serves as the first terminal 1 of the indicating circuit. The anode of D1 serves as the second terminal 2 of the indicating circuit. In fact, this is exactly the same as the above method (b) shown in FIG. 2-2. The terminal 1 in the method (b) is equivalent to the terminal 2 in the method (c) and the terminal 2 in the method (b) is equivalent to the terminal 1 in the method (c). In other words, after the terminals 1 and 2 in FIG. 2-3 are interchanged, it will be exactly the same as the method (b) of FIG. 2-2.

Figures 2, 3, 4:
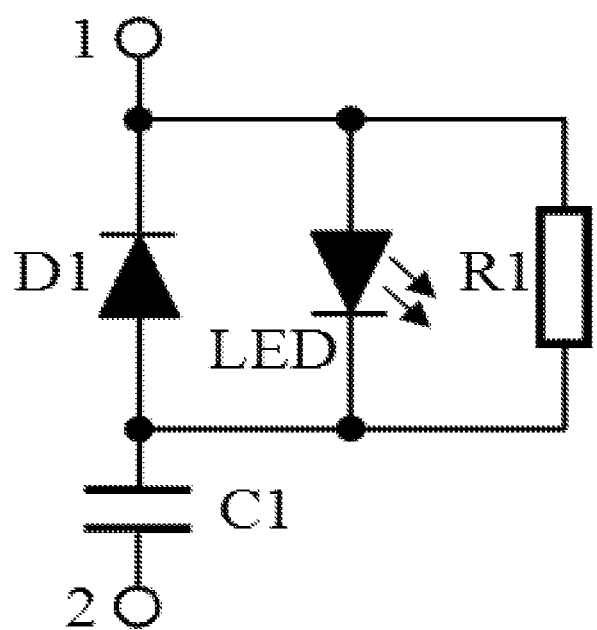
Figure 3:
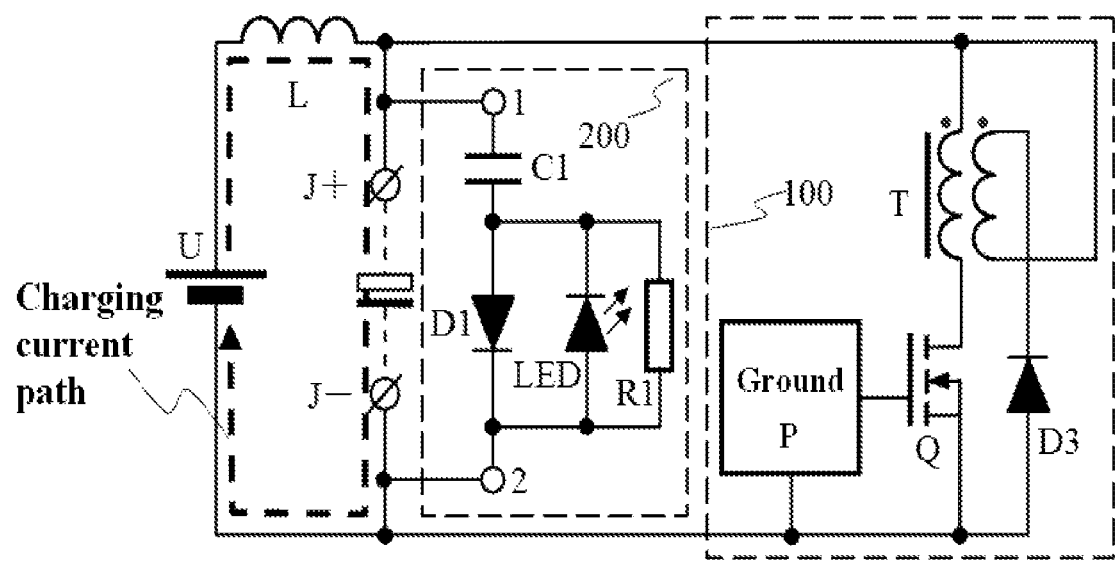
Figure 4:
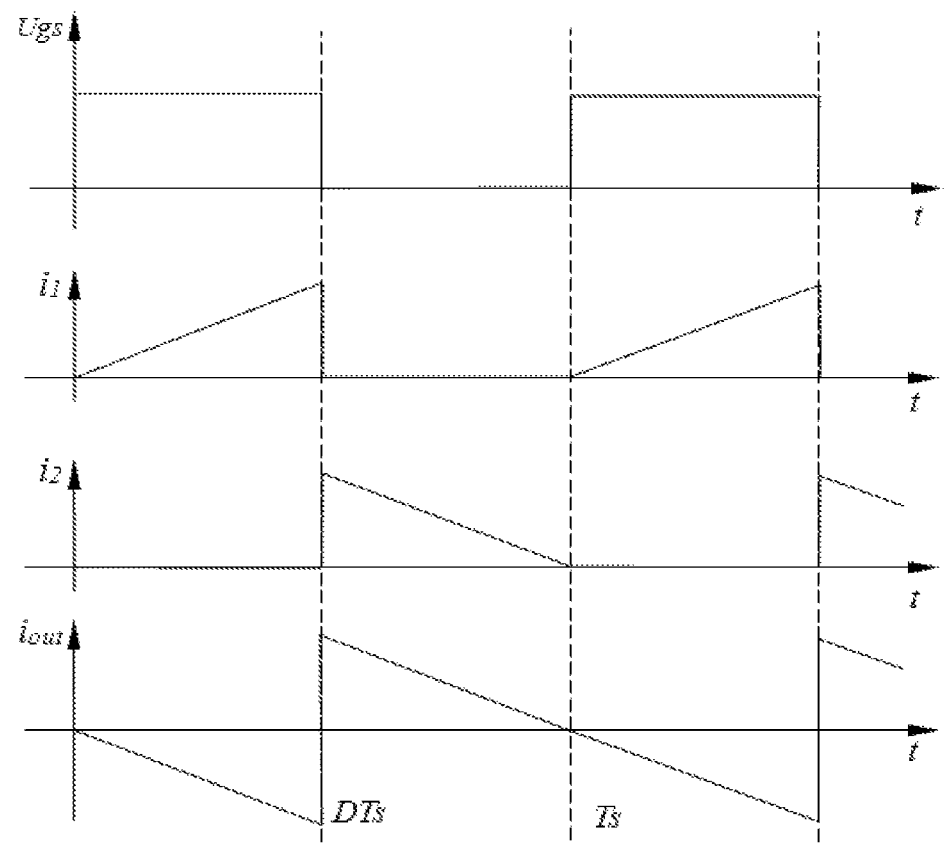

(d) The cathode of D1 is upward and C1 is on the lower side, as shown in FIG. 2-4. The anode of D1 is connected to one end of C1 and the other end of C1 serves as the second terminal 2 of the indicating circuit. The cathode of D1 serves as the second terminal 1 of the indicating circuit. In fact, this is exactly the same as the method (a) shown in FIG. 2-1. The terminal 1 in the method (a) is equivalent to the terminal 2 in the method (d) and the terminal 2 in the method (a) is equivalent to the terminal 1 in the method (d). In other words, after the terminals 1 and 2 in the method (d) are interchanged, it will be exactly the same as the method (a) of FIG. 2-1.

That is, only the method (a) of FIG. 2-1 and the method (b) of FIG. 2-2 as described above are the really effective connection methods. Since the capacitor C1 and the network 24 are connected in series to form a series circuit, the function does not change after the positions of the devices are interchanged, which is the prior art. The method (b) of FIG. 2-2 is equal to the method (a) of FIG. 2-1 with C1 and the network 24 interchanged in position. In other words, the method (a) of FIG. 2-1 and the method (b) of FIG. 2-2 are equivalent in essence. That is, the indicating circuit 200 in the technical solution 1 includes the above four connection methods.

A Φ3 mm red high-brightness light-emitting diode (LED) which is hereinafter referred to as a light-emitting transistor for convenience and of which the model is 3AR2UD. The capacitor C1 is a 333/500 V chip capacitor with the nominal capacity of 0.033 uF. The model of D1 is 1N4148. R1 is a 22 K chip resistor. All components are assembled into an indicating circuit for a switching power supply according to FIG. 2-1 and put into FIG. 1. The technical solution of the first embodiment in the existing patent A is adopted as the lossless ripple current generator 100. The inductor L is a 1 mH inductor and wound using a wire with a diameter of 0.6 mm.

The tested capacitor is an electrolytic capacitor labeled 450BXC47MEFC18×25 and has a nominal withstand voltage of 450 V and a ripple current of 1.2 A. The direct-current power supply U is conditioned to 311 V direct current. After the circuit of the first embodiment is set, the size of the air gap of the magnetic core is adjusted so that the ripple current of the tested capacitor is 1.2 A. LED does not emit light at this point.

Since it is difficult to find an out-of-operation electrolytic capacitor, an adjustable resistor is connected in series to the above tested capacitor to simulate an electrolytic capacitor having a performance degradation. The adjustable range of the adjustable resistor is 0-39Ω herein. When the resistance of the adjustable resistor is adjusted to 5Ω, it is equivalent to that the ESR of a 47 uF/400 V electrolytic capacitor increases to 5.5Ω from about 0.5Ω at good performance, and then the performance of the electrolytic capacitor comes close to be out of service.

At this point, the light-emitting transistor (LED) in FIG. 1 emits light, and the average working current is measured to be 1.6 mA. The sensitivity of indication may be adjusted preliminarily by selecting capacitors C1 in different capacities. The sensitivity is low when the capacity of the capacitor C1 is low; and the sensitivity is high when the capacity of the capacitor C1 is high. Since there is a positive voltage drop of 1.6 V to 2.2 V when the light-emitting transistor emits light, the sensitivity may be adjusted by connecting the resistor R1 to the two ends of the light-emitting transistor (LED) in parallel. For example, in this embodiment, if R1 is a 1.6 K resistor, the voltage generated by a peak current of less than 1 mA across the two ends of R1 is below 1.6 V. The light-emitting transistor (LED) does not emit light at this point.

Note: the on voltage drop of a white light-emitting transistor is about 3.0 V, a red light-emitting transistor and a green light-emitting transistor also have different voltage drops. The on voltage drop of a light emitter in an optical coupler is about 1.1 V. The light emitter in the optical coupler is a light-emitting transistor, too.

Working principle: referring to FIG. 3, when the electrolytic capacitor performs normally, its ESR is 0.5Ω, and there is only one ripple voltage across the two ends of the tested capacitor. Taking working of the lossless current generator 100 under full load with a duty cycle of close to 0.5 for example, description will be made below.

The charging current generated by the direct-current power supply U flows in a path as shown in FIG. 3, which is pure direct current to supplement the loss of the lossless ripple current generator. During this process, the charging current is a direct current, and LED does not emit light due to bias reversal at this point.

Figure 5:
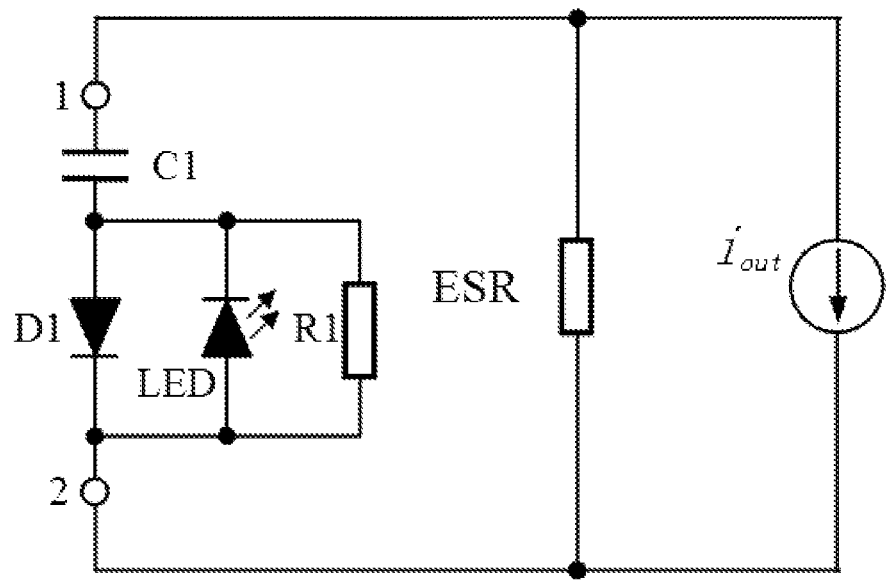
FIG. 5 is a schematic diagram of a voltage drop generated by the working current $i_{out}$ of the tested capacitor on the ESR of the tested capacitor in FIG. 1.

When the tested capacitor performs normally, for example, the above 47 uF/400 V electrolytic capacitor, the ESR thereof at 65 KHz is 0.5Ω. That is, when the switching transistor Q works normally, the exciting current $i_1$ of the main power level is as shown in FIG. 4, wherein Ugs represents a driving voltage for the gate and the source of the switching transistor Q and the demagnetizing current of D3 is $i_2$. The working current of the tested capacitor is $i_{out}$, and the voltage drop produced by this current across the ESR of the tested capacitor is as shown in FIG. 5. A fluctuating high-frequency ripple is present between the terminals 1 and 2, and the waveform thereof is the same as the waveform of $i_{out}$ in FIG. 4. When the ESR of the tested capacitor is low, the peak value of the high-frequency ripple is small, and the selection of appropriate R1 is insufficient to switch on LED to emit light.

When the ESR of the tested capacitor increases to 5.5Ω from about 0.5Ω at good performance, the tested capacitor is close to be out of operation. The voltage drop produced by $i_{out}$ across ESR increases, and a fluctuating high-frequency ripple voltage with a high amplitude is present between the terminals 1 and 2, which is sufficient to switch on LED to emit light.

C1 is 0.033 uF with a low capacity, but may have a capacitive reactance of 73.8Ω at a frequency of 65 KHz and thus can provide a sufficient working current for LED to emit light. The technique to assign a value to C1 is as follows: its capacitive reactance should be greater than 5 times of the expected failure ESR of the tested capacitor at the working frequency of the lossless ripple current generator 100. The reason is that if the capacitive reactance of C1 is close to ESR, C1 will share a great ripple current, resulting in an insufficient ripple current obtained by the tested capacitor. If the capacitive reactance of C1 is greater than 10 times of the expected failure ESR of the tested capacitor, the ripple current obtained by the tested capacitor is closer to a designed value.

The working principle of the present invention is not complicated. C1 is low in capacity and capable of blocking low frequency while allowing high frequency to pass. With increasing ESR of the tested capacitor, the voltage drop generated by the lossless ripple current generator 100 across ESR rises synchronously, and the produced high-frequency ripple voltage rises with the aging of the electrolytic capacitor. C1 is capable of allowing high frequency to pass, and the LED will be turned on to emit light when the high-frequency ripple voltage across ESR reaches a particular threshold that can be adjusted by adjusting the resistance of R1. That is, when the high-frequency ripple voltage is lower than the on voltage of LED by means of the voltage drop produced by the current of the capacitor C1 across the two ends of R1, LED is not switched on. In addition, LED cannot share the current with R1 and thus does not emit light.

Thus, the objective of the invention is achieved by driving the light-emitting transistor (LED) to emit light to inform a user that the ESR of the tested capacitor already increases to a concern point, so that the user can decide a measure of next step. In this embodiment, the LED still emits light after the working current of the lossless ripple current generator 100 is reduced to 30%. When the working current is reduced to 0.36 mA, it is still very bright by using a high-brightness light-emitting transistor.

At this point, the electrolytic capacitor still can work. However, because the exciting current of the main power level across ESR generates more heat, which is 0.22 W in this embodiment, the electrolytic capacitor is already in the condition of accelerated aging under high heat generation. Generally, its ESR will increase rapidly within few tens to few hundreds hours to cause further increased heat generation until the capacitor is out of operation and its capacity is lost. Accordingly, a series of failures such as breaking of the switching transistor and the like would be caused.

The whole circuit also can work normally after the indicating circuit 200 in FIG. 3 is replaced by the circuit of FIG. 2-2, the circuit of FIG. 2-3 or the circuit of FIG. 2-4. It thus can be seen that all the four circuits of the first embodiment can achieve the objective of the present invention.

Actually, in the contents of the first embodiment, the indicating circuit 200 includes 4 implementations. Correspondingly, the ripple current generating circuit of the present invention may be implemented in four manners. In the existing patent A, various changes of the original connection relationship are already provided, which will not be redundantly described herein. The objective of the present invention can be achieved by adding the indicating circuit 200 of the present invention to any of such different connection methods. For brevity, only one general "first embodiment" is adopted for summarization in the present application. In the first embodiment, the current flowing through the light-emitting transistor (LED) is not a direct current, but a high-frequency current at the same frequency with the ripple current generator. When the lead of the LED is long, its electromagnetic radiation cannot be ignored. When the light-emitting transistor (LED) is replaced by a light emitted in an optical coupler, the output current of the optical coupler also appears periodically and is not a stable signal, which may cause trouble to the subsequent circuit. A second embodiment presents a solution.

Second Embodiment

Figure 6:
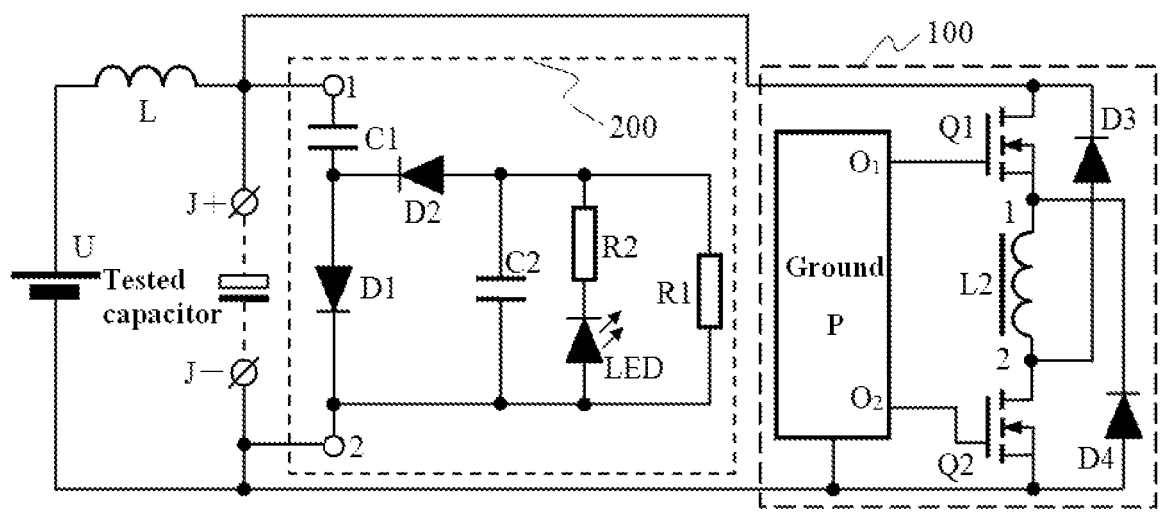
FIG. 6 is a schematic diagram of a second embodiment of the technical solution of the present invention.

Referring to FIG. 6, a ripple current generating circuit, corresponding to the solution 2, comprises a direct-current power supply U, a first inductor L, a lossless ripple current generator 100, and output terminals, including a positive terminal J+ and a negative terminal J−, that are connected to two pins of a tested capacitor. The direct-current power supply U has a positive terminal and a negative terminal. The lossless ripple current generator 100 comprises at least a pulse width modulation control circuit P.

The output terminals are connected in parallel to the direct-current power supply U after being connected in series to the inductor L.

The lossless ripple current generator 100 is connected in parallel to the output terminals, and configured to generate a ripple current and return the electric energy consumed when generating the ripple current to the direct-current power supply U or the tested capacitor nearly without loss.

The pulse width modulation control circuit has a maximum duty cycle of less than 0.5.

Figures 1, 7:
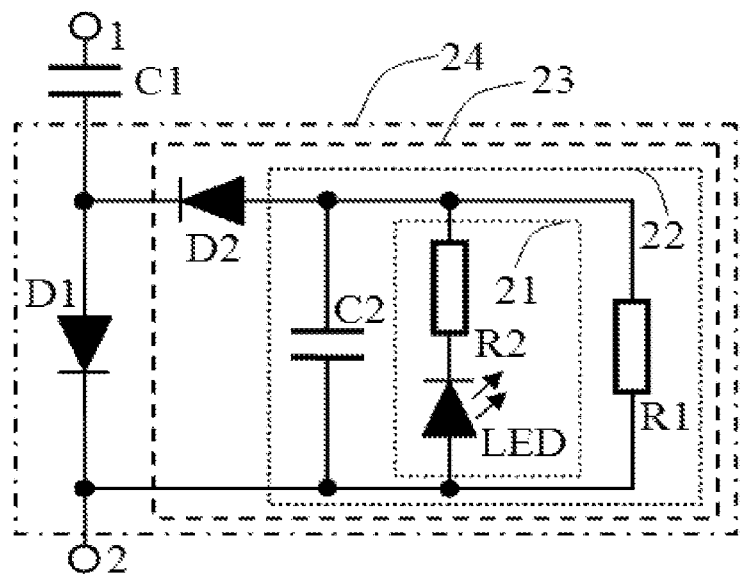
Figures 2, 7:
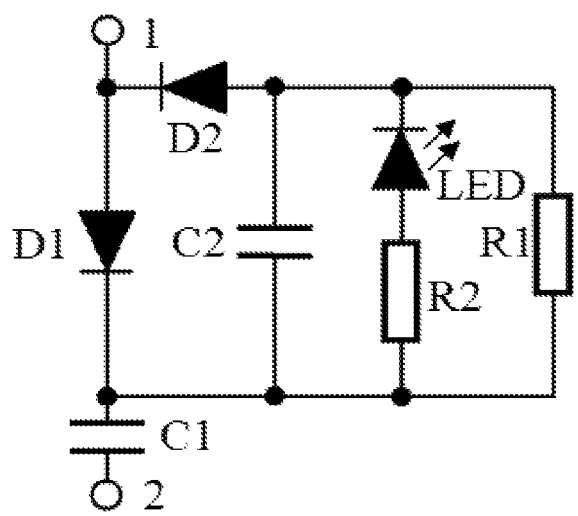
Figures 3, 7:
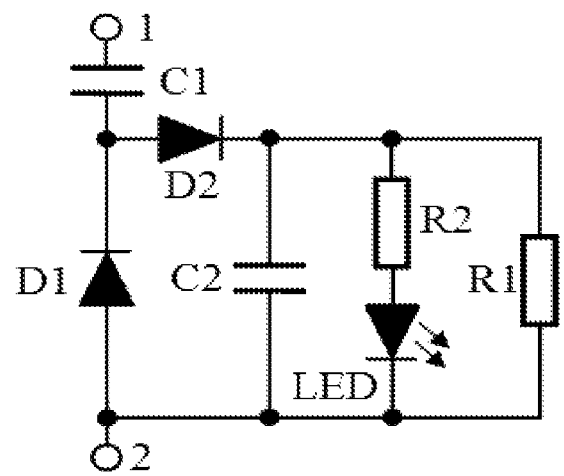
Figures 4, 7:
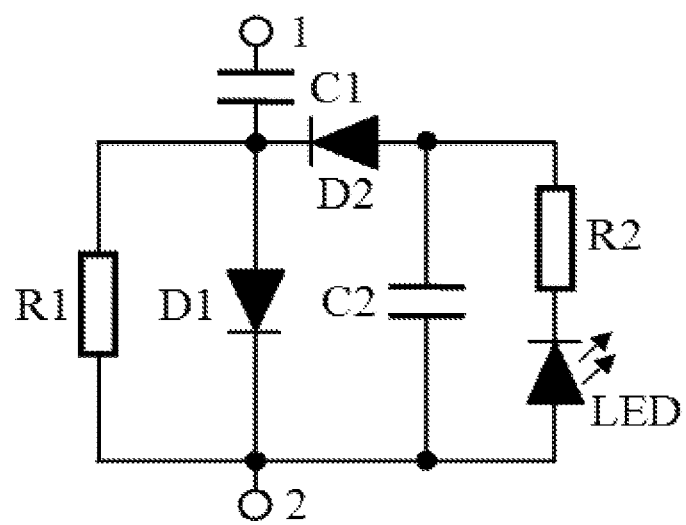

An indicating circuit 200 is further connected in parallel between the positive terminal J+ and the negative terminal J−. The schematic diagram of the separated indicating circuit 200 is as shown in FIG. 7-1. The indicating circuit 200 is characterized by comprising a first resistor R1, a second resistor R2, a first capacitor C1, a second capacitor C2, a first diode D1 and a second diode D2 as well as a first light-emitting diode (LED). The second resistor R2 is connected in series to the first light-emitting diode (LED) to form a first network 21 with two terminals. The first network 21 is connected in parallel to both the second capacitor C2 and the first resistor R1 to form a second network 22 with two terminals. The second network 22 is then connected in series to the second diode D2 to form a third network 23 with two terminals that is characterized in that the second diode D2 and the first light-emitting diode (LED) are in the same direction. The third network 23 is reversely connected in parallel to the first diode D1 to form a fourth network 24 with two terminals. The fourth network 24 is then connected in series to the first capacitor C1 to form a two-terminal series network that is hereinafter referred to as a series network of which the two terminals serve as a first terminal 1 and a second terminal 2, respectively. The series network is also the main body of the indicating circuit 200.

Apparently, the first terminal 1 is connected to the positive terminal J+ and the second terminal 2 is connected to the negative terminal J−. However, the circuit also can work if the first terminal 1 is connected to the negative terminal J− and the second terminal 2 is connected to the positive terminal J+.

The second diode D2 and the first light-emitting diode (LED) are in the same direction. That is, in the third network 23, assuming that R1 is open-circuited, the capacitor C1 is equivalently open-circuited for direct current. Then, the current flowing in from the lower end of the third network 23 passes through the LED, then the D2 and flows out of the upper end of the third network 23. Both D2 and LED are in a forward on state. Such a series connection method is called same direction. When both D2 and LED are in the forward on state, the two are equivalent to a greater-voltage drop diode. The cathode of the greater-voltage drop diode is the cathode of the third network 23 through which the direct current may flow to the outside, and the anode of the same is the anode of the third network 23 through which the direct current may flow in.

The reverse parallel connection of the third network 23 and the first diode D1 means that the cathode of the third network 23 is connected to the anode of D1 and the anode of the third network 23 is connected to the cathode of D1.

The above technical solution 2 may include a plurality of connection relationships, as described below.

R2 may be connected in series to LED in two methods.

(a) The cathode of LED is connected to one end of R2, as shown in network 21 in FIG. 7-1.

(b) The anode of LED is connected to one end of R2, as shown in network 21 in FIG. 7-2.

The two methods are equivalent. The network 21 is connected in parallel to both C1 and R1 to form a network 22 with two terminals. The network 22 is then connected in series to the diode D2. In the network 22, assuming that R1 is open-circuited, the capacitor C2 is equivalently open-circuited for direct current. Then, the network 22 is equivalent to a diode having a unilateral conduction property. The side of the cathode of the LED is the cathode of the second network 22 through which the direct current may flow to the outside, and the side of the anode of the LED is the anode of the third network 23 through which the direct current may flow in. As the same-direction series connection is defined, there are also two methods as follows.

(a) The cathode of the network 22 is connected to the anode of D2, as shown in FIG. 7-1.

(b) The anode of the network 22 is connected to the cathode of D2, as shown in FIG. 7-3.

The fourth network 24 is then connected in series to the first capacitor C1 in two methods as follows.

(a) The anode of D1 of the network 24 is connected to one end of C1, as shown in FIG. 7-1.

(b) The cathode of D1 of the network 24 is connected to one end of C1, as shown in FIG. 7-2.

Like the first embodiment, in the second embodiment, there are three independent series connections, each in two methods, total 8 connections methods. In fact, they are also equivalent.

The technical solution of the first embodiment in the existing patent B is adopted as the lossless ripple current generator 100. The inductor L is a 1 mH inductor and wound using a wire with a diameter of 0.6 mm. The inductor L2 is a power inductor of about 1.3 mH and has an adjustable air gap.

The tested capacitor is an electrolytic capacitor labeled 450BXC47MEFC18×25 and has a nominal withstand voltage of 450 V and a ripple current of 1.2 A. The direct-current power supply U is conditioned to 420 V direct current. The element parameters of the indicating circuit 200 are as follows: C1 being a 473/500 V chip capacitor with the nominal capacity of 0.047 uF, C2 being a 104/16 V chip capacitor, D1 and D2 both being 1N4148, R2 being 1 K, R1 being 10 K, and LED being 3AR2UD.

After the circuit of the second embodiment is set, the size of the air gap of the magnetic core is adjusted so that the ripple current of the tested capacitor is 1.2 A. The LED does not emit light at this point.

Since it is difficult to find an out-of-operation electrolytic capacitor, an adjustable resistor is connected in series to the above tested capacitor to simulate an electrolytic capacitor having a performance degradation. The adjustable range of the adjustable resistor is 0-39Ω herein. When the resistance of the adjustable resistor is adjusted to 4.5Ω, it is equivalent to that the ESR of a 47 uF/400 V electrolytic capacitor increases to 5Ω from about 0.5Ω at good performance, and then the performance of the electrolytic capacitor comes close to be out of service.

At this point, the light-emitting transistor (LED) in FIG. 6 emits light, and the average working current is measured to be 1.9 mA.

Working principle: referring to FIG. 6, when the electrolytic capacitor performs normally, its ESR is 0.5Ω, and there is only one ripple voltage across the two ends of the tested capacitor. The charging current generated by the direct-current power supply U flows in a path as shown in FIG. 3, which is pure direct current to supplement the loss of the lossless ripple current generator.

When the tested capacitor performs normally, for example, the above 47 uF/400 V electrolytic capacitor, the ESR thereof at 65 KHz is 0.5Ω. That is, when the switching transistors Q1 and Q2 work normally, the exciting current $i_1$ of the main power level is as shown in FIG. 4, wherein Ugs represents a driving voltage for the gates and the sources of the switching transistors Q1 and Q2 and the demagnetizing current of D3 and D4 is $i_2$. The working current of the tested capacitor is $i_{out}$, and the voltage drop produced by this current across the ESR of the tested capacitor is as shown in FIG. 5. A fluctuating high-frequency ripple is present between the terminals 1 and 2, and the waveform thereof is the same as the waveform of $i_{out}$ in FIG. 4. When the ESR of the tested capacitor is low, the peak value of the high-frequency ripple is small, and the selection of appropriate R1 is insufficient to switch on the LED to emit light.

When the ESR of the tested capacitor increases to 5.0Ω from about 0.5Ω at good performance, the tested capacitor is close to be out of operation. The voltage drop produced by $i_{out}$ across ESR increases, and a fluctuating high-frequency ripple voltage with a high amplitude is present between the terminals 1 and 2, which is sufficient to switch on the LED to emit light.

C1 is 0.047 uF with a low capacity, but may have a capacitive reactance of 52.1Ω at a frequency of 65 KHz and thus can provide a sufficient working current for the LED to emit light. The technique to assign a value to C1 is as follows: its capacitive reactance should be greater than 5 times of the expected failure ESR of the tested capacitor at the working frequency of the lossless ripple current generator 100. The reason is that if the capacitive reactance of C1 is close to ESR, C1 will share a great ripple current, resulting in an insufficient ripple current obtained by the tested capacitor. If the capacitive reactance of C1 is greater than 10 times of the expected failure ESR of the tested capacitor, the ripple current obtained by the tested capacitor is closer to a designed value.

The whole circuit also can work normally after the indicating circuit 200 in FIG. 6 is replaced by the circuit of FIG. 7-2, the circuit of FIG. 7-3 or the circuit of FIG. 7-4. It thus can be seen that all the four circuits of the second embodiment can achieve the objective of the present invention. Actually, in the contents of the second embodiment, the indicating circuit 200 includes eight implementations. Correspondingly, the ripple current generating circuit of the present invention may be implemented in eight manners. In the existing patent B, various changes of the original connection relationship of the ripple current generating circuit are already provided, which will not be redundantly described herein. The objective of the present invention can be achieved by adding the indicating circuit 200 of the present invention to any of such different connection methods. For brevity, only one general "second embodiment" is adopted for summarization in the present application.

The above are merely descriptions of the preferred embodiments of the present invention. It should be noted that the above preferred embodiments of the present invention should not be deemed to be limitations to the present invention. It would be apparent for those of ordinary skill in the art that various improvements and modifications can also be made without departing from the spirit and the scope of the present invention. For example, a resistor is also connected in series to the first diode, and the resistor R1 in FIG. 7-1, FIG. 7-2, FIG. 7-3 and FIG. 7-4 is directly connected in parallel to the diode D1 instead. For another example, an ampere meter is directly connected in series to the direct-current power supply. However, a mechanical ampere meter cannot output electric signals to the outside, and thus is not applicable, and a digital ampere meter is more complex than the present invention and may cost much, which is not in conformity with the ideal solution principle of TRIZ. Such improvements and modification shall all be deemed to fall into the scope of protection of the present invention, which will not be redundantly described herein with embodiments. The scope of protection of the present invention shall be defined by the claims.

The invention claimed is:

1. A ripple current generating circuit, comprising a direct-current power supply, a first inductor, a lossless ripple current generator, and output terminals, including a positive terminal and a negative terminal, that are connected to two pins of a tested capacitor, wherein an output terminal of the direct-current power supply has a positive terminal and a negative terminal; the lossless ripple current generator comprises at least a pulse width modulation control circuit;

the output terminals are connected in parallel to the direct-current power supply after being connected in series to the inductor;

the lossless ripple current generator is connected in parallel to the output terminals, and configured to generate a ripple current and return the electric energy consumed when generating the ripple current to the direct-current power supply or the tested capacitor nearly without loss;

the pulse width modulation control circuit has a maximum duty cycle of less than 0.5, wherein an indicating circuit is further connected in parallel between the positive terminal and the negative terminal; the indicating circuit is characterized by comprising a first resistor, a first capacitor, a first diode and a first light-emitting diode, with the first resistor, the first diode and the first light-emitting diode being connected in parallel, wherein the first light-emitting diode and the first diode are reversely connected in parallel to form a two-terminal network that is hereinafter referred to as a parallel network of which the terminals are differentiated by an anode of the first diode and a cathode of the first diode; and the parallel network is then connected in series to the first capacitor to form a two-terminal series network that is hereinafter referred to as a series network of which the two terminals serve as a first terminal and a second terminal of the indicating circuit, respectively.

2. The ripple current generating circuit according to claim 1, wherein further comprises another resistor connected in series to the first diode.

3. The ripple current generating circuit according to claim 1, wherein the first light-emitting diode is a light emitter in an optical coupler, i.e., a light-emitting diode in the optical coupler.

4. A ripple current generating circuit, comprising a direct-current power supply, a first inductor, a lossless ripple current generator, and output terminals, including a positive terminal and a negative terminal, that are connected to two pins of a tested capacitor, wherein an output terminal of the direct-current power supply has a positive terminal and a negative terminal; the lossless ripple current generator comprises at least a pulse width modulation control circuit;

the output terminals are connected in parallel to the direct-current power supply after being connected in series to the inductor;

the lossless ripple current generator is connected in parallel to the output terminals, and configured to generate a ripple current and return the electric energy consumed when generating the ripple current to the direct-current power supply or the tested capacitor nearly without loss;

the pulse width modulation control circuit has a maximum duty cycle of less than 0.5, wherein an indicating circuit is further connected in parallel between the positive terminal and the negative terminal; the indicating circuit is characterized by comprising a first resistor, a second resistor, a first capacitor, a second capacitor, a first diode and a second diode and a first light-emitting diode, which are connected as follows: the second resistor being connected in series to the first light-emitting diode to form a first network with two terminals, the first network being connected in parallel to both the second capacitor and the first resistor to form a second network with two terminals, the second network being then connected in series to the second diode to form a third network with two terminals that is characterized in that the second diode and the first light-emitting diode are in the same direction, the third network being reversely connected in parallel to the first diode to form a fourth network with two terminals, and the fourth network being then connected in series to the first capacitor to form a two-terminal series network that is hereinafter referred to as a series network of which the two terminals serve as a first terminal and a second terminal, respectively.

5. The ripple current generating circuit according to claim 4, wherein the first resistor is connected in parallel to the first diode instead.

6. The ripple current generating circuit according to claim 5, wherein further comprises another resistor connected in series to the first diode.

7. The ripple current generating circuit according to claim 5, wherein the first light-emitting diode is a light emitter in an optical coupler, i.e., a light-emitting diode in the optical coupler.

8. The ripple current generating circuit according to claim 4, wherein further comprises another resistor connected in series to the first diode.

9. The ripple current generating circuit according to claim 4, wherein the first light-emitting diode is a light emitter in an optical coupler, i.e., a light-emitting diode in the optical coupler.

* * * * *